United States Patent
Ando et al.

(10) Patent No.: US 10,020,359 B1
(45) Date of Patent: Jul. 10, 2018

(54) LEAKAGE CURRENT REDUCTION IN STACKED METAL-INSULATOR-METAL CAPACITORS

(71) Applicant: INTERNATIONAL BUSINESS MACHINES CORPORATION, Armonk, NY (US)

(72) Inventors: Takashi Ando, Tuckahoe, NY (US); Hemanth Jagannathan, Niskayuna, NY (US); Paul C. Jamison, Hopewell Junction, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/673,559

(22) Filed: Aug. 10, 2017

Related U.S. Application Data

(62) Division of application No. 15/404,860, filed on Jan. 12, 2017.

(51) Int. Cl.
*H01L 21/02* (2006.01)
*H01L 49/02* (2006.01)

(52) U.S. Cl.
CPC ........ *H01L 28/75* (2013.01); *H01L 21/02186* (2013.01); *H01L 21/02244* (2013.01)

(58) Field of Classification Search
USPC .......................................................... 257/532
See application file for complete search history.

(56) References Cited

U.S. PATENT DOCUMENTS

| | | | | |
|---|---|---|---|---|
| 5,440,157 A | * | 8/1995 | Imai | ................... H01L 27/10852 257/310 |
| 5,858,851 A | * | 1/1999 | Yamagata | ........... H01L 27/1085 257/E21.011 |
| 6,177,305 B1 | | 1/2001 | Hornback et al. | |
| 6,204,111 B1 | | 3/2001 | Uemoto et al. | |
| 6,340,827 B1 | * | 1/2002 | Choi | ....................... H01L 28/40 257/310 |
| 6,429,088 B1 | * | 8/2002 | Lau | ......................... H01L 28/55 257/E21.009 |

(Continued)

FOREIGN PATENT DOCUMENTS

JP  2012174707  9/2012

OTHER PUBLICATIONS

Tadahiro Ishizaka et al., Characterization of Advanced Sequential Flow Deposition (ASDF) TiON electrode in MIM structure for leakage current reduction, 2016 IEEE International Interconnect Technology Conference / Advanced Metallization Conference (IITC/AMC), San Jose, CA, May 2016, pp. 180-182.

(Continued)

*Primary Examiner* — Julio J Maldonado
*Assistant Examiner* — Lawrence Tynes, Jr.
(74) *Attorney, Agent, or Firm* — Tutunjian & Bitetto, P.C.; Vazken Alexanian

(57) ABSTRACT

Capacitors and methods of forming the same include forming a dielectric layer on a first metal layer. The dielectric layer is oxygenated such that interstitial oxygen is implanted in the dielectric layer. A second metal layer is formed on the dielectric layer. The dielectric layer is heated to release the interstitial oxygen and to oxidize the first and second metal layers at interfaces between the dielectric layer and the first and second metal layers.

20 Claims, 2 Drawing Sheets

(56) References Cited

U.S. PATENT DOCUMENTS

| | | | |
|---|---|---|---|
| 7,646,050 B2* | 1/2010 | Abe | H01L 21/2855 257/295 |
| 7,655,519 B2 | 2/2010 | Chung et al. | |
| 9,263,437 B2 | 2/2016 | Liang et al. | |
| 9,418,999 B2 | 8/2016 | Wu et al. | |
| 2002/0094587 A1 | 7/2002 | Hong et al. | |
| 2003/0008456 A1* | 1/2003 | Kim | H01L 21/28562 438/240 |
| 2005/0011857 A1* | 1/2005 | Borland | H01G 4/1218 216/13 |
| 2009/0085156 A1 | 4/2009 | Dewey et al. | |
| 2009/0238954 A1* | 9/2009 | Suh | H01G 4/1227 427/79 |
| 2010/0073845 A1* | 3/2010 | Suh | H01G 4/12 361/303 |
| 2012/0309162 A1* | 12/2012 | Chen | H01L 28/40 438/396 |
| 2015/0171207 A1 | 6/2015 | Liang et al. | |
| 2015/0171161 A1 | 7/2015 | Liang et al. | |
| 2016/0043088 A1 | 2/2016 | Cartier et al. | |
| 2016/0087028 A1* | 3/2016 | Hirota | H01L 28/40 257/532 |

OTHER PUBLICATIONS

A.W. Groeland et al., On the leakage problem of MIM capacitors due to improper etching of titanium nitride, STW, ICT Conference 2010, Nov. 18-19, 2010, Veldhoven, The Netherlands, pp. 89-92.
List of IBM Patents or Patent Applications Treated as Related dated Aug. 10, 2017, 2 pages.

\* cited by examiner

LEAKAGE CURRENT REDUCTION IN STACKED METAL-INSULATOR-METAL CAPACITORS

BACKGROUND

Technical Field

The present invention generally relates to stacked metal-insulator-metal capacitors and, more particularly, to the formation of barrier layers in such capacitors to reduce leakage currents.

Description of the Related Art

As semiconductor fabrication technologies improve, forming high-density metal-insulator-metal capacitors (MIMCAPs) becomes challenging. MIMCAPs are conventionally formed in between layers of a device, for example using a thin stack that covers a large area.

To obtain a sufficiently high capacitance density (i.e., capacitance per unit area), three-dimensional capacitor structures are employed with high-k dielectric insulators. For example, three-electrode stacked capacitors have been implemented to address the challenge of providing high capacitance for decoupling capacitors.

However, a large percentage of the chip area (e.g., up to about 95%) may need to be covered with such decoupling capacitors to achieve the total capacitance value needed. Such high areas mean that leakage current must be reduced as much as possible, otherwise the power loss due to leakage currents will be substantial.

SUMMARY

A method of forming a capacitor includes forming a dielectric layer on a first metal layer. The dielectric layer is oxygenated such that interstitial oxygen is implanted in the dielectric layer. A second metal layer is formed on the dielectric layer. The dielectric layer is heated to release the interstitial oxygen and to oxidize the first and second metal layers at interfaces between the dielectric layer and the first and second metal layers.

A method of forming a capacitor includes forming a high-k dielectric layer on a first titanium nitride layer. The high-k dielectric layer is oxygenated such that interstitial oxygen is implanted in the high-k dielectric layer. A second titanium nitride layer is formed on the high-k dielectric layer. The high-k dielectric layer is heated to release the interstitial oxygen and to oxidize the first and second titanium nitride layers at interfaces between the high-k dielectric layer and the first and second titanium nitride layers, forming barrier layers at the interfaces to reduce leakage current between the first and second titanium nitride layers.

A capacitor includes a first metal layer formed on a substrate. A dielectric layer is formed over the first metal layer. A second metal layer is formed over the dielectric layer. A first oxidized barrier layer is formed on a surface of the first metal layer at an interface with the dielectric layer. A second oxidized barrier layer is formed on a surface of the second metal layer at an interface with the dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
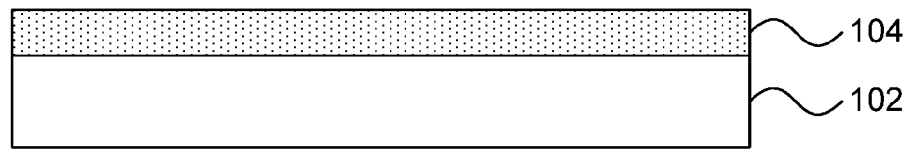
FIG. 1 is a cross-sectional diagram of a step in the formation of a metal-insulator-metal capacitor having improved resistance in accordance with an embodiment of the present invention.

Embodiments of the present invention provide metal-insulator-metal capacitors (MIMCAPs) that make use of two metal layers with an insulator layer between them. During fabrication, the insulator layer is treated to reduce impurities and to introduce interstitial oxygen in the insulator layer. During subsequent processing steps (e.g., conventional back end of line (BEOL) processes), the interstitial oxygen is released by the insulator layer into the metal layers above and below. The oxygen reacts with the metal in the metal layers, forming barrier layers between the metal layers and the insulator layer.

These barrier layers have a higher work function than the metal layers and increase the barrier height between the electrodes and the conduction band of the insulator layer, resulting in lower leakage currents and, thus, superior capacitor performance. In addition, this process for forming the barrier layers does not compromise the resistivity of the metal layers.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can pass both an orientation of above and below. The device can be otherwise orientated (rotated 90 degrees or at other orientations), and the spatially relative descriptors used herein can be interpreted accordingly. In addition, it will also be understood that when a layer referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to FIG. 1, a cross-sectional view of a step in the formation of a capacitor is shown. A first metal layer 104 is formed on an interlayer dielectric 102. It should be understood that, while dielectric materials are particularly contemplated for the interlayer dielectric 102, it should be understood that other substrates such as, e.g., polymers, glass, resins, etc. may be used instead. It is specifically contemplated that the interlayer dielectric 102 can be, e.g., silicon dioxide, silicon nitride, or a low-k dielectric such as SiCOH.

The first metal layer 104 may be formed from any appropriate conductive metallic material. It is specifically contemplated that the first metal layer 104 may be formed from, e.g., titanium nitride, although other materials may be used if they will react with oxygen to form an insulating barrier layer. The first metal layer 104 may be formed by any appropriate process including, e.g., chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
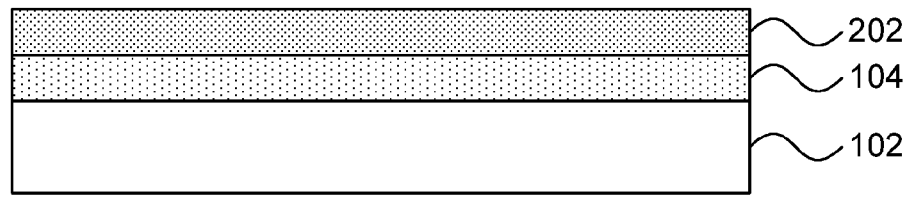
FIG. 2 is a cross-sectional diagram of a step in the formation of a metal-insulator-metal capacitor having improved resistance in accordance with an embodiment of the present invention.

Referring now to FIG. 2, a cross-sectional view of a step in the formation of a capacitor is shown. A dielectric layer 202 is deposited on the first metal layer 104 using any appropriate process including, e.g., CVD, PVD, ALD, or GCIB. The dielectric layer 202 may be formed from any appropriate dielectric material, but is specifically contemplated as being a high-k dielectric material such as, e.g., hafnium dioxide, zirconium dioxide, aluminum oxide, tantalum oxide, and multilayers thereof. As used herein, the term "high-k" refers to a dielectric material having a dielectric constant k that is higher than that of silicon dioxide.

Figure 3:
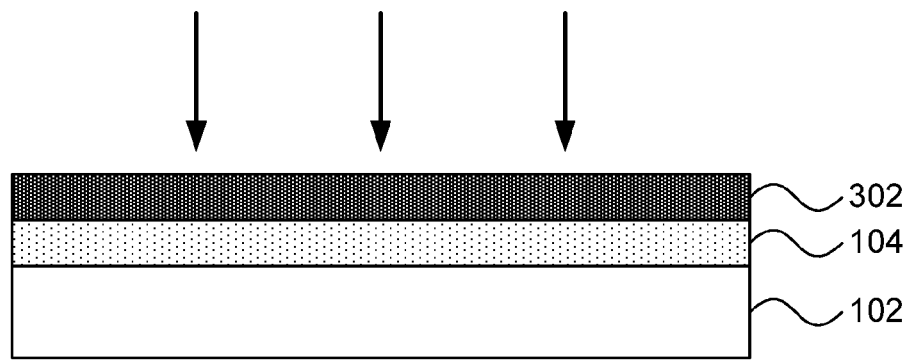
FIG. 3 is a cross-sectional diagram of a step in the formation of a metal-insulator-metal capacitor having improved resistance in accordance with an embodiment of the present invention.

Referring now to FIG. 3, a cross-sectional view of a step in the formation of a capacitor is shown. The dielectric layer 202 is doped with interstitial oxygen using, e.g., an ozone anneal or plasma treatment with an oxygen-containing species. This oxygenation process turns the dielectric layer 202 into oxygenated dielectric layer 302. The oxygenation is carried out at a temperature compatible with BEOL processing (e.g., about 400° C. or lower). Some portion of the supplied oxygen atoms react with in-film carbon impurities and improve the film quality. The unreacted oxygen atoms remain in the high-k film as interstitial oxygen, which can have an areal density on the order of $10^{12}$ to $10^{13}$ atoms/cm$^2$.

Figure 4:
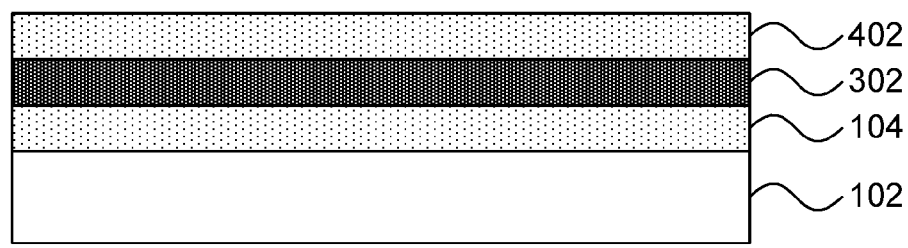
FIG. 4 is a cross-sectional diagram of a step in the formation of a metal-insulator-metal capacitor having improved resistance in accordance with an embodiment of the present invention.

Referring now to FIG. 4, a cross-sectional view of a step in the formation of a capacitor is shown. A second metal layer 402 is deposited on top of the oxygenated dielectric layer 302. It is specifically contemplated that the second metal layer 402 may be formed from, e.g., titanium nitride, although other materials may be used if they will react with oxygen to form an insulating barrier layer. It is furthermore contemplated that the second metal layer 402 will be formed from the same material as the first metal layer 104, although in some embodiments these two materials may differ. The second metal layer 402 may be formed by any appropriate deposition process including, e.g., CVD, PVD, ALD, or GCIB.

Figure 5:
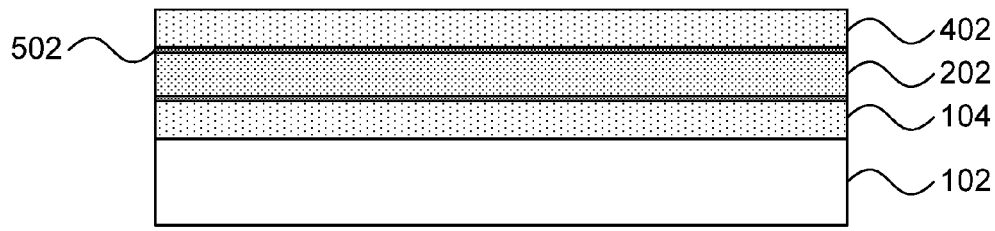
FIG. 5 is a cross-sectional diagram of a step in the formation of a metal-insulator-metal capacitor having improved resistance in accordance with an embodiment of the present invention.

Referring now to FIG. 5, a cross-sectional view of a step in the formation of a capacitor is shown. During subsequent BEOL processing steps, the temperature of the layered structure may rise to, e.g., between about 350° C. and about 400° C. BEOL processing may include a variety of steps including, e.g., anneals, etches, and other steps that may be needed to complete a device or chip. It should be noted that these temperatures are provided purely for the purpose of illustration and should not be construed as limiting in any way. The interstitial oxygen in the oxygenated dielectric layer 402 is not stable at the temperatures mentioned above. Over the course of BEOL processing (e.g., about two hours), the oxygen moves out of the oxygenated dielectric layer 302 to the interfaces between the dielectric layer 202 and the first metal layer 104 and the second metal layer 402.

The oxygen interacts with the surfaces of the first and second metal layers 104 and 402, oxidizing the material of the first and second metal layers 104 and 402 at the interfaces between those layers and the dielectric layer 202 to form barrier layers 502. In an embodiment where the first and second metal layers 104 and 402 are formed from titanium nitride, the barrier layers 502 oxidize to form titanium oxynitride. As compared to titanium oxynitride layers deposited by conventional processes, the resistivity of the first and second metal layers 104 and 402 is not compromised beyond the barrier layers 502. Only material at the interface is oxidized, and only to a depth determined by the quantity of oxygen in the oxygenated dielectric layer 302, leaving the bulk of the first and second metal layers 104 and 402 unaffected. The oxidation of the metal layers 104 and 402 is furthermore self-limiting, because the reaction stops as soon as all of the interstitial oxygen in the oxygenated dielectric layer 302 is depleted. Dielectric layer 202 remains after the barriers 502 are formed.

In one exemplary embodiment, the first metal layer 104 and the second metal layer 402 may have thicknesses between about 10 nm and about 50 nm. The dielectric layer 202 may have thickness between about 2 nm and about 10 nm. When the barrier layers 502 are formed, the barrier layers 502 may have an exemplary thickness between about 0.1 nm and about 3.0 nm. The areal density of the interstitial oxygen is adjusted by the doping process conditions to obtain a desired thickness for the barrier layers 502, depending on the thickness of the dielectric layer 202. In a specific embodiment, using titanium nitride and hafnium dioxide for the metal layers 104/402 and the dielectric layer 202 respectively, the formation of the barrier layers 502 reduces leakage current across a given capacitor area by about 70%.

Respective electrodes may be connected to the first metal layer 104 and the second metal layer 402 to provide electrical connectivity to the resulting capacitor. One or both metal layers 104/402 may be patterned to provide a desired capacitance and to make room for other structures to pass through. As noted above, it is contemplated that the capacitor may occupy a significant portion of the chip area, with the stacked MIMCAP layers being arranged parallel to the surface of the device. The MIMCAP thereby forms a parallel plate capacitor, with its capacitance being proportional to its area.

Figure 6:
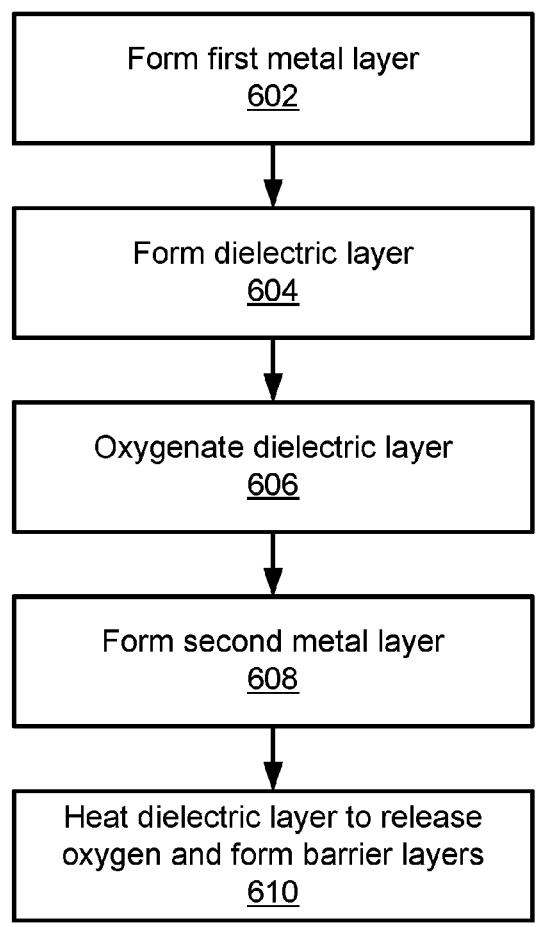
FIG. 6 is a block/flow diagram of a method of forming a metal-insulator-metal capacitor having improved resistance in accordance with an embodiment of the present invention.

Referring now to FIG. 6, a method of forming a MIMCAP is shown. Block 602 forms a first metal layer 104 on an interlayer dielectric. As noted above, the first metal layer 104 is specifically contemplated as being titanium nitride, but any appropriate metallic, conductive material may be used if it will react with oxygen to produce an appropriate barrier layer. Block 602 deposits the first metal layer 104 using any appropriate deposition process such as, e.g., CVD, PVD, ALD, or GCIB.

Block 604 forms the dielectric layer 202 on the first metal layer 104. It is specifically contemplated that the dielectric layer 202 may be formed from any appropriate high-k dielectric material such as, e.g., hafnium dioxide, but any other dielectric material may be used instead. Block 604 forms the dielectric layer 202 using any appropriate deposition process such as, e.g., CVD, PVD, ALD, or GCIB.

Block 606 oxygenates the dielectric layer 202 to form oxygenated dielectric layer 302. Block 606 may, for example, perform a thermal anneal in an ozone environment or may perform a plasma treatment with an oxygen-containing species. The oxygenated dielectric layer 302 traps interstitial oxygen in an unstable manner, such that the oxygen can be released later.

Block 608 forms the second metal layer 402 on the oxygenated dielectric layer 302. As noted above, the second metal layer 402 is specifically contemplated as being titanium nitride, but any appropriate metallic, conductive material may be used if it will react with oxygen to produce an appropriate barrier layer. Furthermore, the second metal layer 402 may be formed from the same material as the first metal layer 104 or may, alternatively, be formed from a different material. Block 608 deposits the second metal layer 402 using any appropriate deposition process such as, e.g., CVD, PVD, ALD, or GCIB.

Block 610 performs BEOL processes that raise the temperature of the device to an exemplary temperature between about 350° C. and about 400° C. The interstitial oxygen in the oxygenated dielectric layer 302 is unstable at such temperatures and diffuses out to the interface between the oxygenated dielectric layer 302 and the metal layers 104/402. There the oxygen oxidizes the metal layers 104/402 at the interfaces. This process continues until the interstitial oxygen in the oxygenated dielectric layer 302 is depleted, leaving the dielectric layer 202 without interstitial oxygen. The oxidized material forms barrier layers 502 between the metal layers 104/402 and the dielectric layer 202.

After formation of the MIMCAP, other processes may be performed to finish the device. In particular, electrical contacts (not shown) may be connected to the respective metal layers 104 and 402 to provide electrical connectivity to the terminals of the MIMCAP. As noted above, the metal layers 104 and 402 may be patterned to accommodate other structures on a chip and additional layers of inter-layer dielectric and circuit components may be formed on top of the second metal layer 402.

In addition, more complicated MIMCAP structures may be formed. For example, additional layers of dielectric and metal may be formed. In one particular embodiment, there can be three metal layers, with high-k dielectric layers between them. In such an embodiment, there are multiple steps of depositing a dielectric, oxygenating the dielectric, and depositing an upper metal layer before annealing the oxygenated dielectric to release the interstitial oxygen and form barrier layers at the interfaces.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a capacitor, comprising:
   forming a high-k dielectric layer on a first titanium nitride layer;
   oxygenating the high-k dielectric layer such that interstitial oxygen is implanted in the high-k dielectric layer;
   forming a second titanium nitride layer on the high-k dielectric layer; and
   heating the high-k dielectric layer to release the interstitial oxygen and to oxidize the first and second titanium nitride layers at interfaces between the high-k dielectric layer and the first and second titanium nitride layers, forming barrier layers at the interfaces to reduce leakage current between the first and second titanium nitride layers.

2. The method of claim 1, wherein oxygenating the dielectric layer comprises performing a thermal anneal in an ozone environment.

3. The method of claim 1, wherein oxygenating the dielectric layer comprises performing a plasma treatment with an oxygen-containing species.

4. The method of claim 1, wherein heating the dielectric layer comprises heating the dielectric layer to a temperature between about 350° C. and about 400° C.

5. The method of claim 1, wherein the high-k dielectric material comprises hafnium dioxide.

6. The method of claim 1, further comprising patterning one or both of the first and second titanium nitride layers to control a shape of the capacitor.

7. The method of claim 1, wherein the barrier layers have a higher work function that the first and second titanium nitride layers.

8. The method of claim 1, further comprising forming the first titanium nitride layer directly on an interlayer dielectric layer before forming the high-k dielectric layer.

9. The method of claim 8, wherein the interlayer dielectric layer comprises a dielectric material selected from the group consisting of silicon dioxide, silicon nitride, and SiCOH.

10. The method of claim 1, wherein oxygenating the high-k dielectric layer implants the high-k dielectric layer with an areal density of oxygen between about $10^{12}$ and about $10^{13}$ atoms/cm$^2$.

11. The method of claim 1, wherein the barrier layers comprise titanium oxynitride.

12. A method of forming a capacitor, comprising:
    forming a first titanium nitride layer directly on an interlayer dielectric layer;
    forming a high-k dielectric layer on the first titanium nitride layer;
    oxygenating the high-k dielectric layer such that interstitial oxygen is implanted in the high-k dielectric layer;
    forming a second titanium nitride layer on the high-k dielectric layer; and
    heating the high-k dielectric layer to release the interstitial oxygen and to oxidize the first and second titanium nitride layers at interfaces between the high-k dielectric layer and the first and second titanium nitride layers, forming titanium oxynitride barrier layers at the interfaces to reduce leakage current between the first and second titanium nitride layers.

13. The method of claim 12, wherein oxygenating the dielectric layer comprises performing a thermal anneal in an ozone environment.

14. The method of claim 12, wherein oxygenating the dielectric layer comprises performing a plasma treatment with an oxygen-containing species.

15. The method of claim 12, wherein heating the dielectric layer comprises heating the dielectric layer to a temperature between about 350° C. and about 400° C.

16. The method of claim 12, wherein the high-k dielectric material comprises hafnium dioxide.

17. The method of claim 12, further comprising patterning one or both of the first and second titanium nitride layers to control a shape of the capacitor.

18. The method of claim 12, wherein the barrier layers have a higher work function that the first and second titanium nitride layers.

19. The method of claim 12, wherein the interlayer dielectric layer comprises a dielectric material selected from the group consisting of silicon dioxide, silicon nitride, and SiCOH.

20. The method of claim 12, wherein oxygenating the high-k dielectric layer implants the high-k dielectric layer with an areal density of oxygen between about $10^{12}$ and about $10^{13}$ atoms/cm$^2$.

* * * * *